(12) United States Patent
Meyer-Berg et al.

(10) Patent No.: US 9,105,562 B2
(45) Date of Patent: Aug. 11, 2015

(54) INTEGRATED CIRCUIT PACKAGE AND PACKAGING METHODS

(75) Inventors: Georg Meyer-Berg, Munich (DE); Frank Daeche, Unterhaching (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 706 days.

(21) Appl. No.: 13/326,527

(22) Filed: Dec. 15, 2011

(65) Prior Publication Data
US 2012/0286414 A1    Nov. 15, 2012

Related U.S. Application Data

(63) Continuation-in-part of application No. 13/103,124, filed on May 9, 2011.

(51) Int. Cl.
*H01L 21/28* (2006.01)
*H01L 23/00* (2006.01)
*H01L 23/13* (2006.01)
(Continued)

(52) U.S. Cl.
CPC .............. *H01L 24/19* (2013.01); *H01L 21/28* (2013.01); *H01L 23/13* (2013.01); *H01L 23/49822* (2013.01); *H01L 24/20* (2013.01); *H01L 23/49816* (2013.01); *H01L 23/49827* (2013.01); *H01L 24/05* (2013.01); *H01L 24/06* (2013.01); *H01L 24/16* (2013.01); *H01L 24/73* (2013.01); *H01L 25/0655* (2013.01); *H01L 2224/0557* (2013.01); *H01L 2224/06181* (2013.01); *H01L 2224/16225* (2013.01); *H01L 2224/73267* (2013.01); *H01L 2924/014* (2013.01); *H01L 2924/01029* (2013.01); *H01L 2924/01322* (2013.01); *H01L 2924/13055* (2013.01); *H01L 2924/1431* (2013.01); *H01L 2924/15153* (2013.01); *H01L 2924/15311* (2013.01)

(58) Field of Classification Search
CPC .................... H01L 24/01; H01L 24/80; H01L 2224/24147
See application file for complete search history.

(56) References Cited

U.S. PATENT DOCUMENTS

| 4,477,828 A | 10/1984 | Scherer |
| 6,350,954 B1 | 2/2002 | Specks et al. |
| 7,323,766 B2 | 1/2008 | Weiblen et al. |

(Continued)

FOREIGN PATENT DOCUMENTS

| CN | 101536181 A | 9/2009 |
| CN | 102779808 A | 11/2012 |

(Continued)

OTHER PUBLICATIONS

Office Action received for U.S. Appl. No. 13/103,124, dated Sep. 8, 2014, 16 pages.

(Continued)

*Primary Examiner* — Jae Lee

(57) ABSTRACT

An integrated circuit packaging method includes fabricating a package module from successive build-up layers which define circuit interconnections, forming a cavity on a top-side of the package module, attaching a metalized back-side of a chip onto a metallic layer, the chip having a front-side with at least one forward contact, disposing the chip in the cavity such that at least one forward contact is electrically connected to at least one of the circuit interconnections of the package module, and coupling the metallic layer that is attached to the chip onto the top-side of the package module.

11 Claims, 9 Drawing Sheets

(51) Int. Cl.
   *H01L 23/498*  (2006.01)
   *H01L 25/065*  (2006.01)

(56)  References Cited

U.S. PATENT DOCUMENTS

| | | |
|---|---|---|
| 8,536,691 B2 | 9/2013 | Kikuchi et al. |
| 2001/0001989 A1 | 5/2001 | Smith |
| 2005/0101161 A1 | 5/2005 | Weiblen et al. |
| 2005/0127489 A1 | 6/2005 | Mallik et al. |
| 2007/0025092 A1 | 2/2007 | Lee et al. |
| 2007/0085201 A1 | 4/2007 | Bauer et al. |
| 2008/0186690 A1 | 8/2008 | Miettinen et al. |
| 2008/0205008 A1 | 8/2008 | Sun et al. |
| 2009/0283895 A1 | 11/2009 | Kikuchi et al. |
| 2010/0081236 A1* | 4/2010 | Yang et al. ............ 438/119 |
| 2010/0123241 A1 | 5/2010 | Shi et al. |
| 2010/0140779 A1 | 6/2010 | Lin et al. |
| 2010/0187676 A1 | 7/2010 | Suh et al. |
| 2011/0260336 A1 | 10/2011 | Kang et al. |
| 2012/0146177 A1* | 6/2012 | Choi et al. ............ 257/528 |
| 2012/0286413 A1 | 11/2012 | Meyer-Berg et al. |

FOREIGN PATENT DOCUMENTS

| | | |
|---|---|---|
| DE | 10352002 A1 | 6/2005 |
| JP | 08335650 A | 12/1996 |
| JP | 2004087700 A | 3/2004 |

OTHER PUBLICATIONS

Office Action issued in the corresponding DE Application No. 102012112328.4, mailed on Nov. 13, 2013, 7 pages.
Office Action issued in the corresponding DE Application No. 102012112327.6, mailed on Nov. 13, 2013, 10 pages.

\* cited by examiner

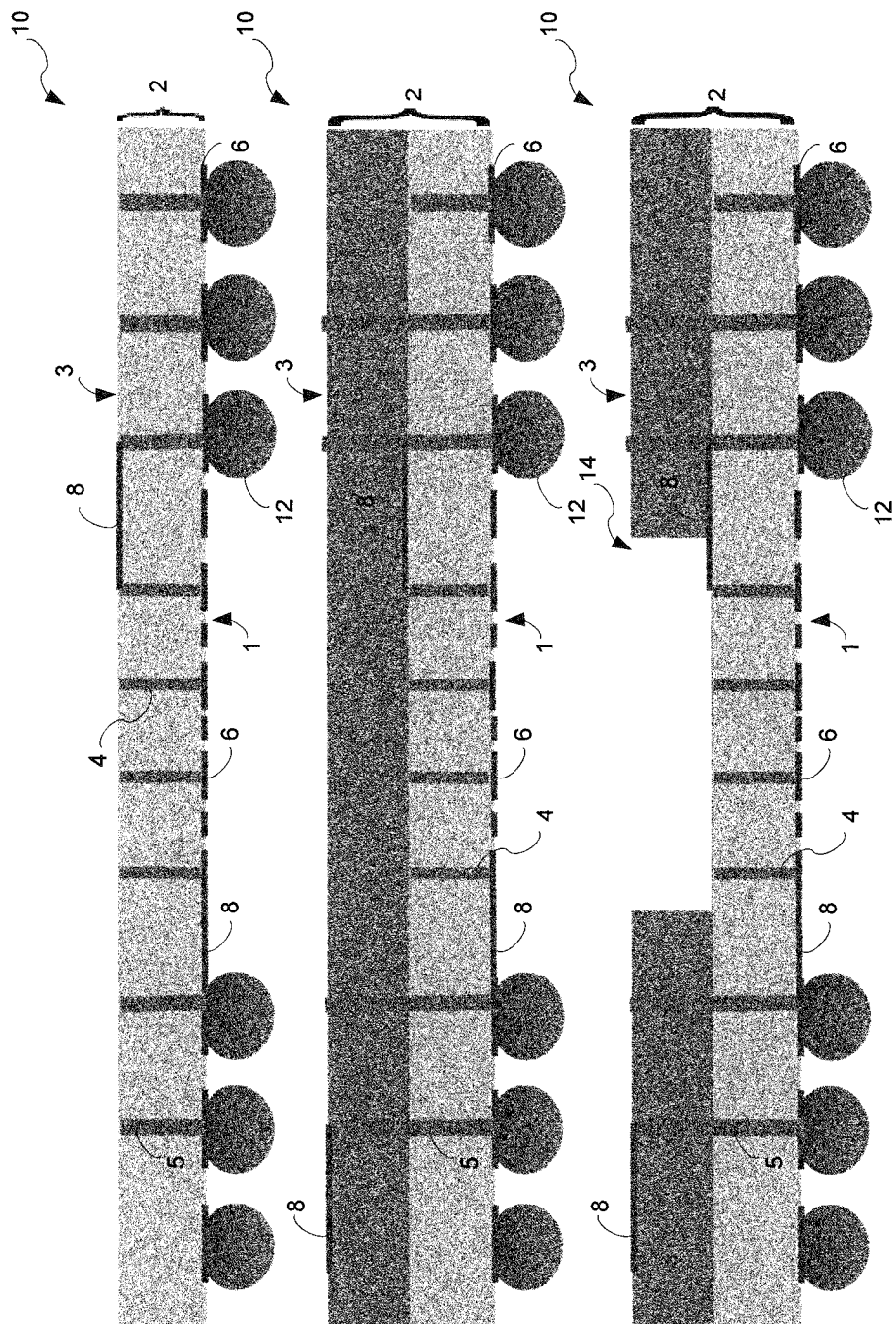

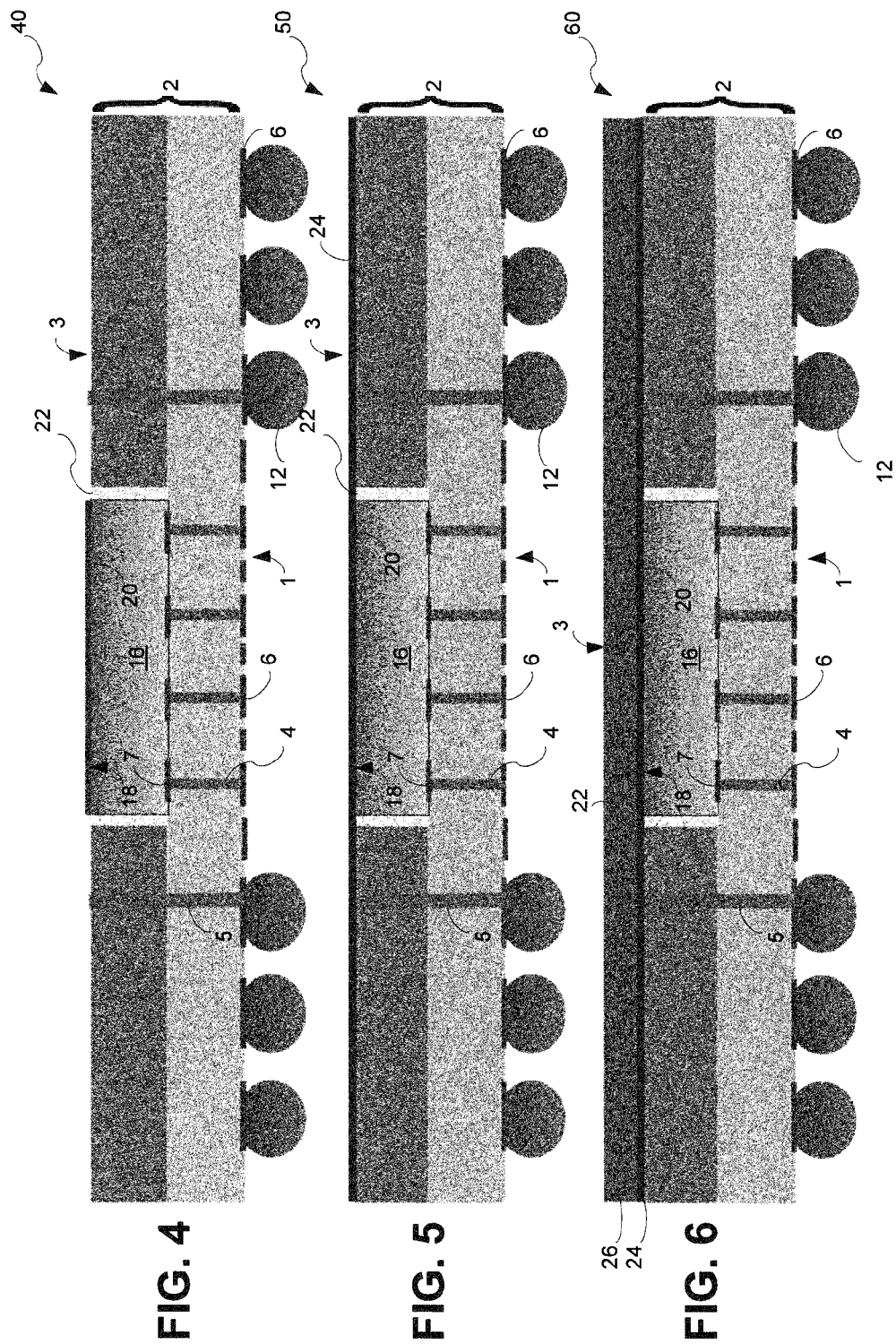

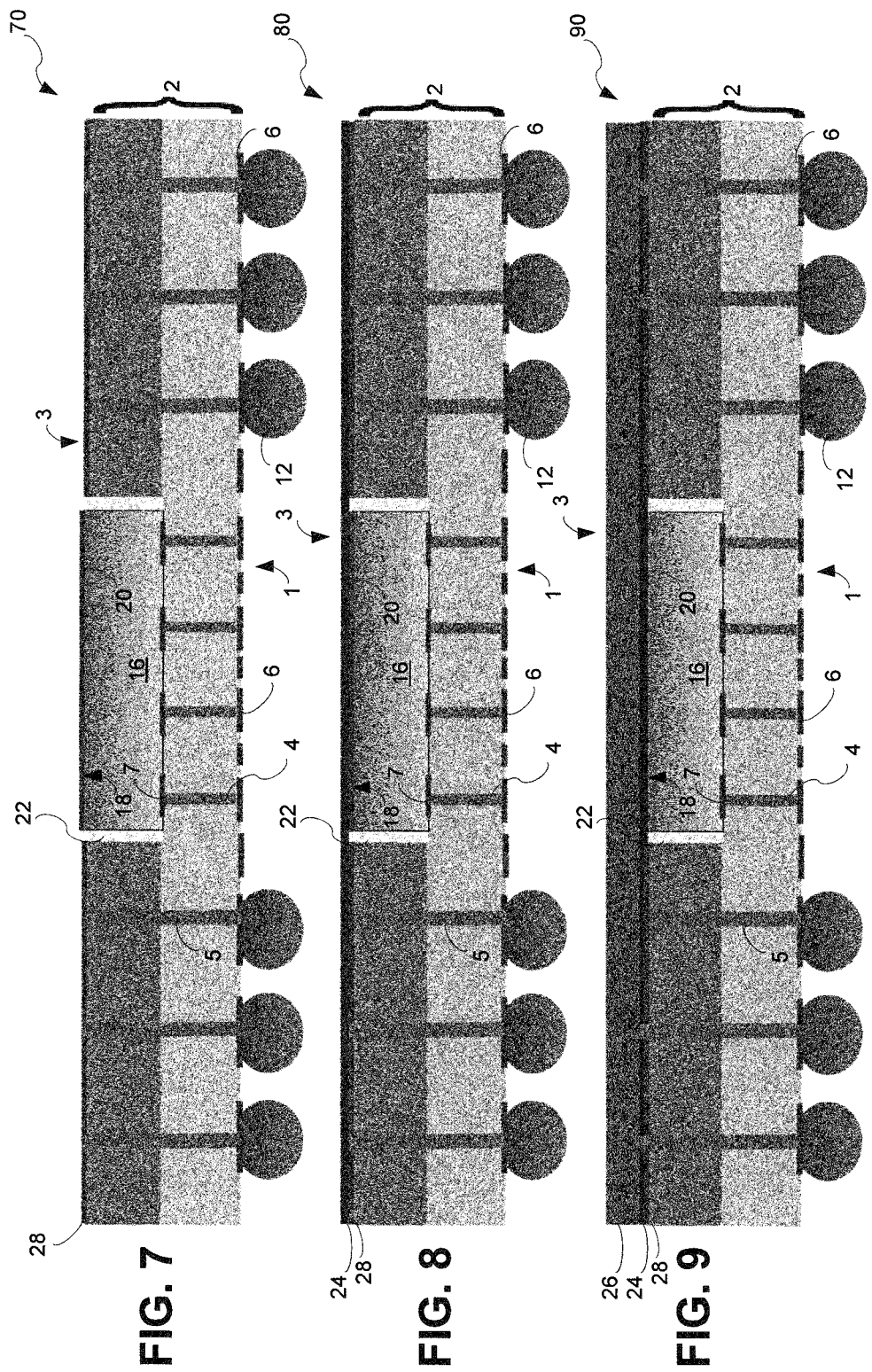

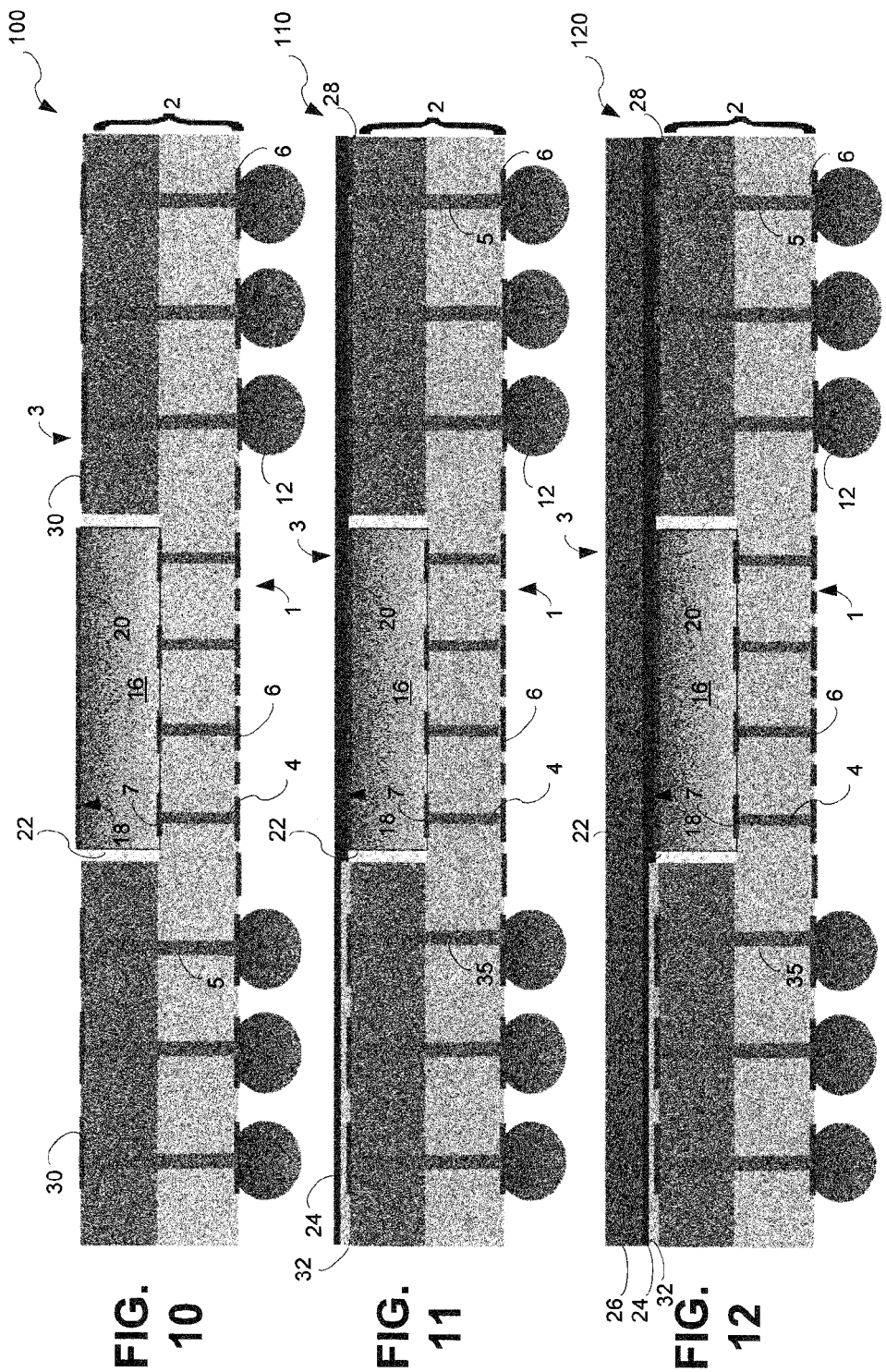

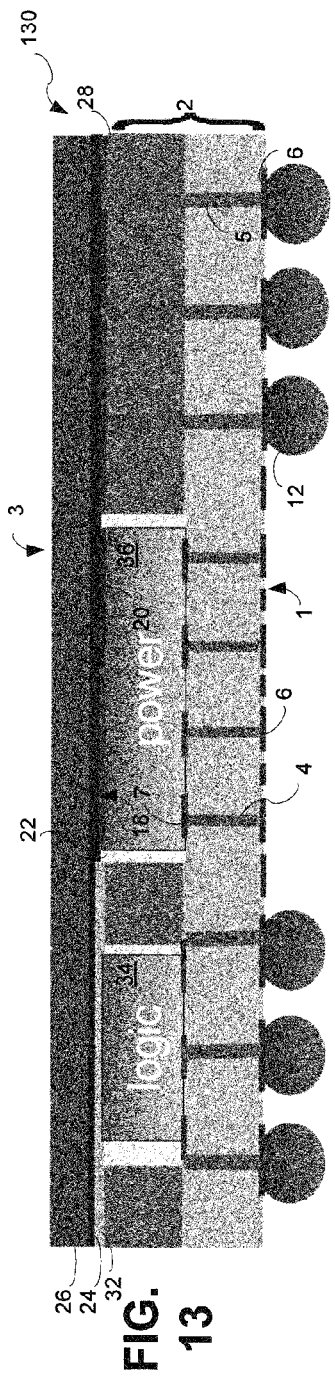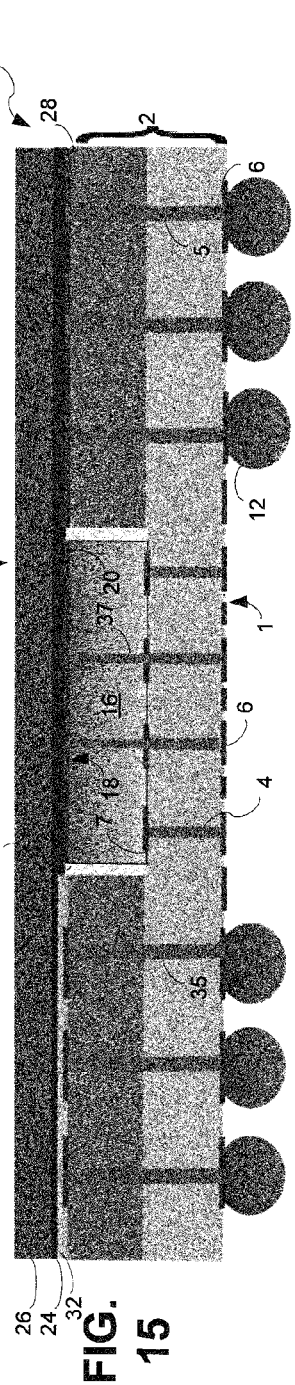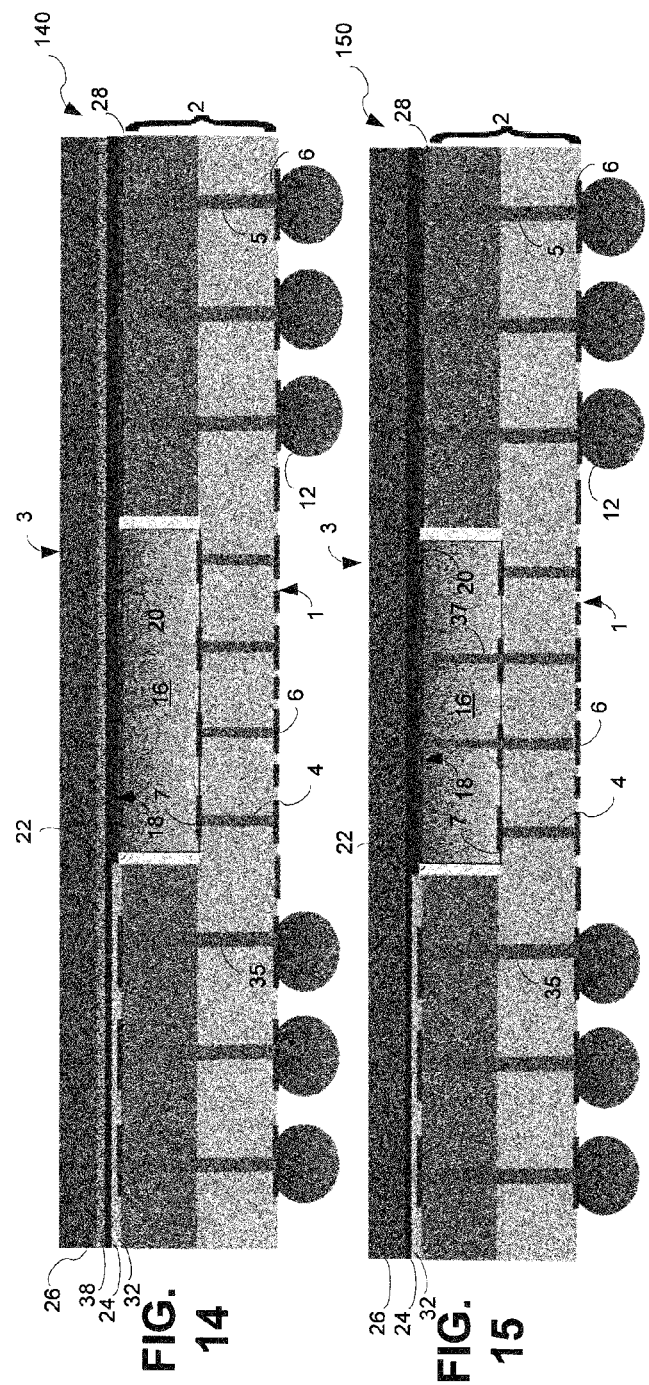

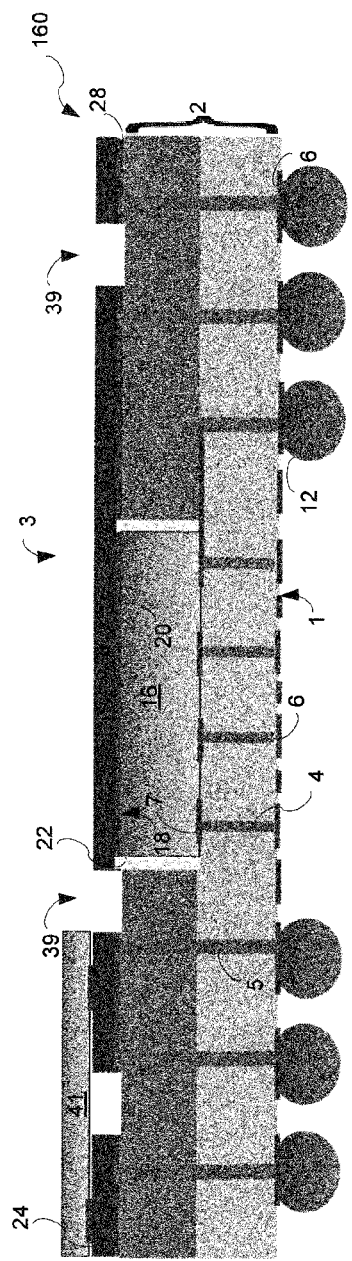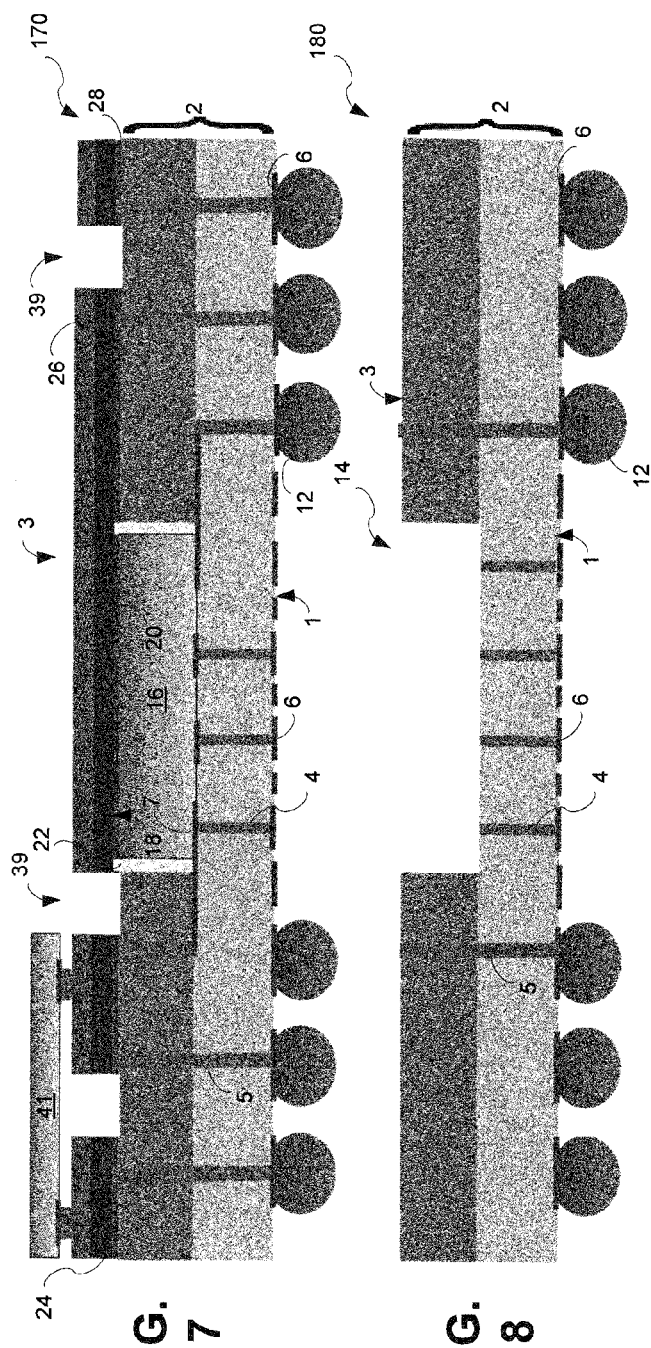
FIG. 16
FIG. 17
FIG. 18

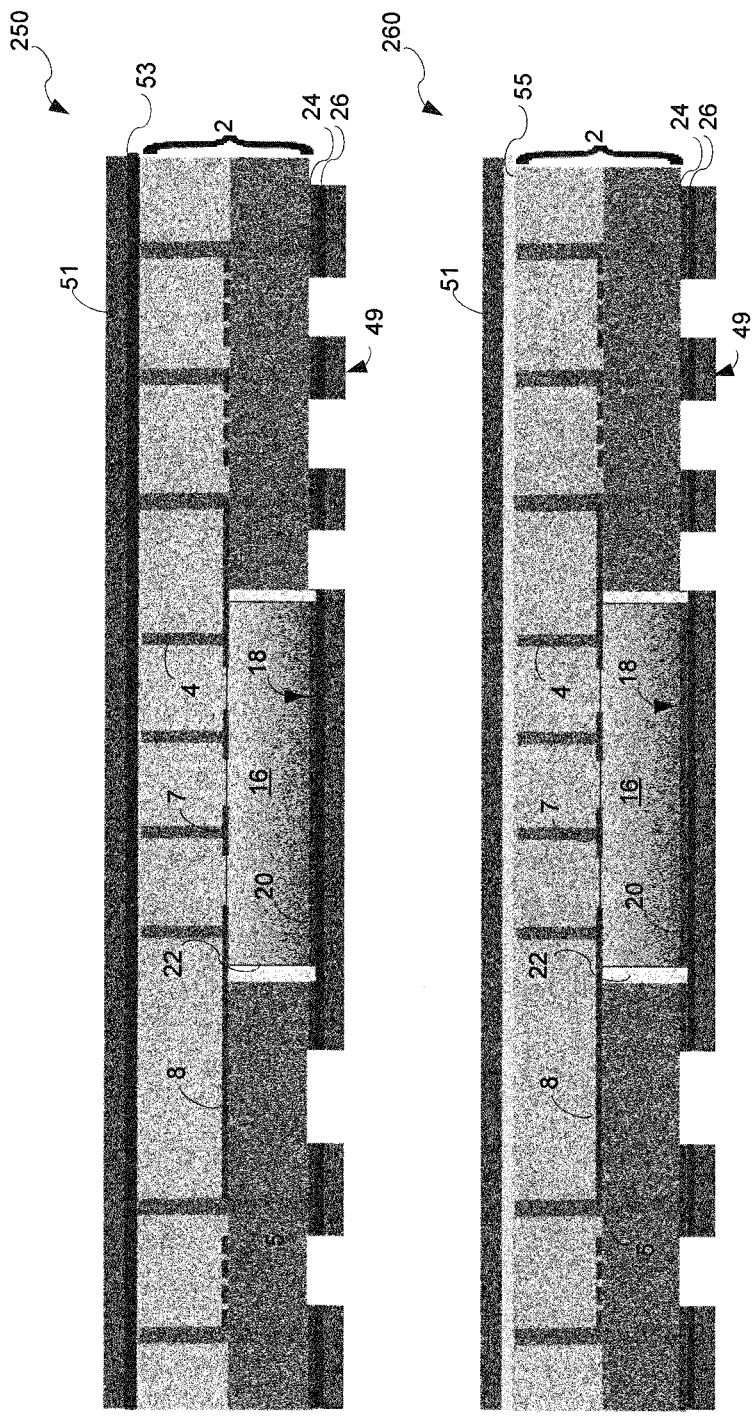

INTEGRATED CIRCUIT PACKAGE AND PACKAGING METHODS

CROSS-REFERENCE TO RELATED APPLICATIONS

The present application is a continuation-in-part application of U.S. application Ser. No. 13/103,124 filed May 9, 2011 now pending, the entirety of which is herein incorporated by reference.

FIELD OF THE DISCLOSURE

This disclosure relates to apparatus and methods for manufacturing circuits and, more particularly, to apparatus and methods for packaging integrated circuits.

BACKGROUND

Integrated circuit (IC) chips are usually incorporated into a package. Such packaging provides, for example, physical and environmental protection as well as heat dissipation. Moreover, packaged chips typically provide electrical leads to allow integration with further components.

Several IC packaging techniques have been developed. One such technique, for example is described in, Lee et al., "Embedded Actives and Discrete Passives in a Cavity Within Build-up Layers," U.S. patent application Ser. No. 11/494,259 filed on Jul. 27, 2006 and published as US 2007/0025092 A1 on Feb. 1, 2007, the content of which is hereby incorporated by reference in its entirety. Lee et al. discloses, inter alia, a so-called chip-last approach.

In contrast to a chip-first or chip-middle process, a chip-last approach embeds a given chip after all build-up layer processes are finished. The advantages of this approach are now well known, however, chip-last packaging is not thought to be appropriate for all chip types. For example, for ICs having a back-side contact, and for those chips whose operating parameters call for dissipation of higher quantities of heat, such as power chips and high-performance logic chips.

SUMMARY

In one implementation, in order to provide a package module appropriate for a wide range of chip types, including power chips, chips having a back-side contact, and high performance logic chips, an integrated circuit packaging method includes fabricating a package module from successive build-up layers which define circuit interconnections, forming a cavity on a top-side of the package module, attaching a metalized back-side of a chip onto a metallic layer, the chip having a front-side with at least one forward contact, disposing the chip in the cavity such that the set of forward contacts are electrically connected to one or more of the circuit interconnections of the package module, and coupling the metallic layer that is attached to the chip onto the package module.

Similarly, in another implementation, an integrated circuit package includes a package module with a cavity formed therein. The package module may be formed as a laminate from successive build-up layers which define a top-side, a bottom-side and circuit interconnections therebetween. Following a chip-last approach, the cavity may be formed on the top-side of the package module. Typically, the formation of the cavity exposes one or more of the circuit interconnections, for example at the bottom of the cavity. A chip has a front-side with a set of forward contacts and a metalized back-side that is attached to a metallic layer such that the metallic layer covers at least a part of the back-side of the chip, and the top-side of the package module may be disposed in the cavity such that the set of forward contacts are electrically connected to one or more of the circuit interconnections of the package module. The chip is disposed in the cavity such that the set of forward contact is electrically connected to one or more of the circuit interconnections of the package module, and the metallic layer covers at least a part of the top-side of the package module.

One or more of the following features may be included or combined in the above implementations. Attaching the metalized back-side of the chip onto the metallic layer may be done with a high temperature process. Attaching the metalized back-side of the chip onto the metallic layer may be done with a diffusion soldering process. The metallic layer may be a metal foil layer. The back-side of the chip may be a low ohmic contact. Current may flow vertically between the low ohmic contact and the set of forward contacts of the chip. The chip may be a power electronics chip. The low ohmic contact may be electrically connected, for example through electrical connection with the metallic layer, to one or more vias formed in the package module. The chip may be a high-performance logic chip. The metallic layer may have thermally conductive properties facilitating heat spreading. The metallic layer may be attached to a heat sink. The chip may include through silicon vias. All or a portion of the metallic layer may be coupled to the back-side of the chip and the top-side of the package module by way of an isolating middle layer. The chip may be mounted in a reverse mount configuration. A reverse mount configuration is where the metalized back-side of the chip faces towards the printed circuit board and front-side of the chip faces away from the printed circuit board.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIGS. 1-3 show an exemplary process flow, from a cross-sectional view, for fabricating an exemplary package module;

FIG. 4 illustrates a cross-sectional view of an exemplary integrated circuit package with a chip having back-side contact;

FIG. 5 illustrates a cross-sectional view of an exemplary integrated circuit package with a top layer;

FIG. 6 illustrates a cross-sectional view of an exemplary integrated circuit package with a heat sink and/or metal foil layer;

FIGS. 7-9 illustrate cross-sectional views of exemplary integrated circuit packages as in FIGS. 4-6 with a top-side package contact;

FIG. 10-12 illustrate cross-sectional views of exemplary integrated circuit packages as in FIGS. 4-6 with top-side pads and/or isolating middle layers;

FIG. 13 illustrates a cross-sectional view of an exemplary integrated circuit package with multiple chips;

FIG. 14 illustrates a cross-sectional view of an exemplary integrated circuit package with an isolated heat spreading layer;

FIG. 15 illustrates a cross-sectional view of an exemplary integrated circuit package with a chip having through silicon vias;

FIGS. 16 and 17 illustrate cross-sectional views of exemplary integrated circuit packages with a backside of nano metal or solder on plated, sputtered, or structured metal, and an optional isolated heat sink and/or metal foil layer thereon;

FIGS. 18-21 show another exemplary process flow, from a cross-sectional view, for fabricating an exemplary package module;

FIGS. 23-26 illustrate various further embodiments of a cross-sectional view of an exemplary integrated circuit package in a reverse mount configuration.

DETAILED DESCRIPTION

Figure 19:
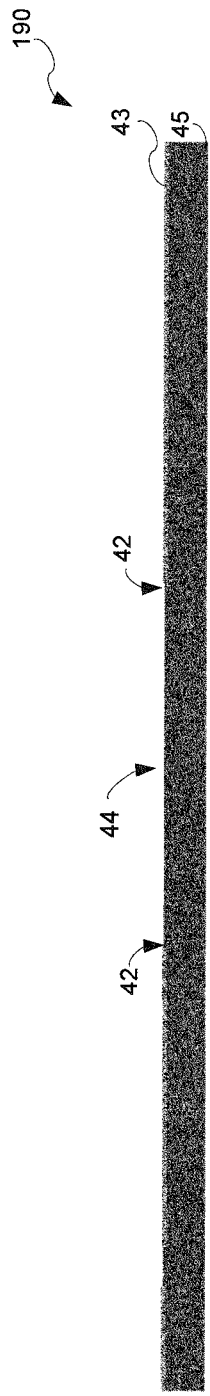

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1-3 show an exemplary process flow, from a cross-sectional view, for fabricating an exemplary package module 10. The exemplary process flow, or method, for integrated circuit packaging may be implemented as follows.

In FIG. 1, package module 2 may begin to be formed from successive build-up layers (a laminate) which define a top-side 3, a bottom-side 1 and circuit interconnections 4. Such circuit interconnections 4 may be vias formed in the manner described below with regard to vias 5 and/or include, for example, embedded passive components such as circuit wiring, capacitors, resistors, and/or inductors. For example, it may include layered routing 8, formed, for example of structured metal. Circuit interconnections 4 may be made using standard high density interconnections technology, and may have bottom-side pads 6 electrically coupled thereto provided on bottom-side 1 of package module 2. Further, in addition to traditional layering techniques, the build-up layering process may also include depositing thin film on an ultra-thinned core.

Vias 5 may also be formed in package module 2 by, for example, mechanical numerical control (NC) drilling, laser drilling, formations of successive build-up layers, or by other means known in the art. After via holes are formed, vias 5 may be metalized by electroless plating or electrolytic plating, for example.

Solder balls 12 may be provided in electrical connection with vias 5 and/or circuit interconnections 4 providing a contact terminus on bottom-side 1 of package module 2 of integrated circuit package 10 for connection, such as to a printed circuit (PC) board.

In FIG. 2, further successive build-up layers are added to the formation of package module 2. This process results in embedding passive components into package module 2. In this manner all layers of the package may contain structured metal for routing of, for example, signals, power, and ground.

In FIG. 3 a cavity 14 is formed on a top-side 3 of package module 2. Laser drilling, amongst other techniques, may be used to form cavity 14. Once cavity 14 is formed, connection pads, if not already present, may be added by conventional methods to circuit interconnections 4 exposed in cavity 14. As discussed below with reference to FIG. 4, cavity 14 should preferably be formed such that a chip 16 is capable of being disposed in cavity 14.

FIG. 4 illustrates a cross-sectional view of an exemplary integrated circuit package 40 with chip 16 having a back-side contact. Such chips include, for example, IGBTs, through which current flows vertically (i.e. from back to front through the silicon substrate) from the back-side contact of the chip to its front-side. Chip 16, having a set of forward contacts 7, and depending upon the type of chip, having back-side contact 20 on back-side 18 is disposed into cavity 14 such that forward contacts 7 are electrically connected to one or more of circuit interconnections 4 of package module 2. Back-side 18 of chip 16 is generally metalized during wafer processing. Thus further processing of chips during packaging, as described herein, is understood as being distinct processes and distinct resulting layers. Forward contacts 7 of chip 16 may be formed during the chip's normal fabrication process, and may be electrically connected through circuit interconnections 4 to bottom-side 1 of package module 2. Gaps between chip 16 and package module 2, if present, may be filled such as with a fill material 22. Fill material 22 may also be used as an underfill material (not shown), thereby embedding a chip.

Other configurations may include chip 16 being a high-performance logic chip. Such a high-performance logic chip may include, for example, an Intel® Core™, an AMD® Phenom II™, or an IBM® Z196™. Another configuration may include chip 16 being a thinned chip.

FIG. 5 illustrates a cross-sectional view of an exemplary integrated circuit package 50 with a top layer. A top layer 24 is provided, such as by plating (as, for example, after surface treatment of the laminate material forming package module 2) onto at least a portion of top-side 3 of package module 2 as discussed above with respect to integrated circuit package 10 (FIGS. 1-3), and at least a portion of back-side 18 of chip 16. Alternatively, top layer can be sputtered metal, plated following sputtering, a metallic layer formed by application of dirty plasma, or ink jetted over some or all of the chip and/or top-side 3 of package module 2. Typically, top layer 24 may be coupled to back-side 18 of chip 16 and covers at least a part of chip 16 and the top-side of package module 2. Advantageously, top layer 24 may be a metallic layer such as copper for instance or a structured metal. Depending on the application and type of chip used, the coupling between chip 16 and top layer 24 may establish a thermal and/or electrical connection with back-side 18 of chip 16.

In an implementation wherein top layer 24 establishes an electrical connection with back-side 18 of chip 16, top layer 24 may advantageously be positioned in electrical contact with one or more vias 5, thereby establishing an electrical connection from back-side 18 of chip 16 to bottom-side 1 of package module 2. In particular, for chips having a back-side contact 20, electrical connection between contact 20 and bottom-side 1 is thus established.

In use, integrated circuit package 50 may be connected to outside circuitry such as through a PC board (not shown). Electrical current provided to chip 16 through the electrical connections established at bottom-side 1 of package module 2 flows to forward contacts of chip 16 through circuit interconnections 4 and to back-side contact 20 through vias 5. For example, chip 16 may be a so-called "power chip", or a power electronics chip having a low-ohmic back-side contact. Such chips may operate with current flowing vertically through the chip, such as between back-sides 18 toward forward contacts 7. In such a case, back-side contact 20 is typically a low-ohmic contact, which may be formed on chip 16 during or after fabrication of chip 16. In such a case, electrical contact between low ohmic back-side contact 20 and vias 5 allow the basic integrated circuit package 10 described above in FIGS. 1-3 to function with power chips having low-ohmic back-side contacts through the addition of an electrically conductive top layer 24 when used in the configuration of circuit package 50 of FIG. 5.

In addition to the provision of access to a back-side electrical connection in integrated circuit package 50, use of power chips in high-performance applications may also generate additional heat when compared with chips having lower current handling capability or current requirements. Careful selection of material used in top layer 24 may help, owing to the characteristics of the material selected to diffuse heat in addition to its ability to conduct electrical current. Therefore, materials such as copper, copper alloys, silver, nickel, and similar materials with a high thermal and/or electrical conductivity are particularly suitable for use as top layer 24. When used for heat spreading in this manner, good thermal coupling between chip 16 and top layer 24 is desirable. Further heat dissipating efficiency can be obtained by maximizing the surface area of top layer 24, and the percentage of that area exposed to ambient air for example, and/or by increasing the thickness of top layer 24 to increase thermal mass and/or ensure efficient spreading of heat throughout top layer 24 by conduction.

Where heat generated during operation of chip 16 is not adequately dissipated by integrated circuit package 50, additional thermal structures may be added without affecting the ability of top layer 24 to function as an electrical connection to a back-side contact, such as back-side contact 20 of chip 16. Accordingly, and as described below with reference, for example, to FIG. 6, top layer 24 may be configured to act as both an electrical connector and as a thermal heat spreader, resulting in circuit package 60, having superior thermal characteristics in addition to the electrical features of integrated circuit package 50.

Although some chips such as high performance logic chips may not have a low ohmic back-side contact 20, such high performance logic chips may, like power chips, generate high temperatures beyond those readily dissipated by the chip or by its packaging. In such a case, top layer 24 can be selected from materials such as copper that provide good heat spreading characteristics. Thus, top layer 24 may be made of any material that furthers the above described functionality, in particular materials that have high electrical and/or thermal conductive properties, as the particular chip 16 may require. Therefore, whether or not electrical contact to the back-side of a chip is needed, the present package configuration provides a structure and method consistent with a chip-last approach to packaging that can accommodate chips having a wide range of design requirements.

If top layer 24 is composed of metal it may be implemented, for example, with any suitable type of plated metal, sputtered metal, structured metal, metal foil or combination thereof and moreover may be attached, for example, by gluing or soldering top layer 24 to chip 16, such as in the case of metal foil, and to the top-side of package module 2, such as by an adhesive. Other methods of application may also be used, such as in a nano paste, through deposition with dirty plasma, or by sputtering or solder. Depending on the configuration, one or more of the above can be used in combination, for example taking into consideration the affinity of materials to each other.

Dirty plasma is known as a plasma with supporting gas which has particle-sized metal powder suspended therein. This method is particularly advantageous in forming a layer having sufficient material thickness and minimal additional processing to obtain top layer 24 after chip 16 has been placed within package module 2.

If top layer 24 is glued, it might be desirable that the glue possess high electrical and/or thermal conductive properties in order to facilitate the advantages of electrical and/or thermal connectivity with top layer 24 as heretofore described. Examples of such glue include, for example, Tanaka® TS-333™ and Lord® MT-815™. By contrast, where insulation (either thermal and/or electrical) is desired, different material would be selected for this purpose.

In other configurations, in which top layer 24 may be attached with solder, soldering might include eutectic soldering. Another configuration might include nano metal as top layer 24. In such configurations, metal itself may naturally adhere as a part of its application as top layer 24 on back-side 18 of chip 16 and to the top-side of package module 2.

Vias 5 may terminate at solder balls 12 which in turn may be used to connect to outside circuitry such as, for example, a printed circuit board. This allows low ohmic back-side contact 20 to be connected to bottom-side 1 of package module 2 and therefrom to circuitry outside package 40. Further vias 5 may be beneficial, for example, in logic chips that require a ground contact, or for radio frequency (RF) shielding purposes. Similarly, vias 5 may be beneficial, for example, in grounding power chips.

In order to balance the electrical load in, for example, high performance chips, multiple vias 5 may be connected to top layer 24 to split the current across multiple vias 5. In another application, vias 5, when connected to low ohmic back-side contact 34 as described, may act as part of a feedback loop.

As noted above, top layer 24 may function as a heat spreader instead of, or in addition to being part of the electrical connection between back-side contact 20 and bottom-side 1 of package module 2. As the surface area of top layer 24 typically exceeds the area of back-side 18 of chip 16, a significant increase in heat dissipation from chip 16 will occur through heat spreading in top layer 24 depending on the material used and configuration (such as thickness) thereof. However, where additional heat dissipation is required additional thermal structures can be provided.

FIG. 6 illustrates a cross-sectional view of an exemplary integrated circuit package 60 with a heat sink and/or metal foil layer 26. As illustrated, top layer 24 may be directly attached to heat sink and/or metal foil layer 26 providing thermal contact therewith. Heat sink and/or metal foil layer 26 may be attached, for example, mechanically or adhered to top layer 24 with nano paste, glue, dirty plasma (such as in combination with plating and solder), or solder (such as after sputter and plating of 5 μm of copper), thermal compound or eutectic soldering.

In the instance where 26 functions as a heat sink, it may be designed, for example, with straight fins or pin fins and be constructed of copper or aluminum or other materials with high thermal conductivity to increase its efficiency. Moreover, such a heat sink is preferably well ventilated by ambient air. Aided by the heat spreading properties of top layer 24, such as when top layer 24 is formed of copper, the efficiency of the heat sink is improved.

In the instance where 26 is a metal foil layer, it may be coupled onto top layer 60, and constructed of, for example, copper. Metal foil layer 26 may serve the same purpose as a heat sink, namely, metal foil layer may serve as a means for dissipating heat and/or may also help with high current loads, such as where layers 24 and 26 function together to provide electrical contact to back-side contact 20 of chip 16.

Other heat sink methods may also be used for heat sink and/or metal foil layer 26. For example, an active fan may blow cool external air across a set of heat sink fins. In another example, the heat sink may be liquid cooled with an apparatus circulating liquid.

FIGS. 7-9 illustrate cross-sectional views of exemplary integrated circuit packages (70, 80, and 90 respectively) as in FIGS. 4-6 with a top-side package contact 28. In this alternative approach top-side 3 has a contact applied thereto thus forming a top-side package contact 28. Similar to FIGS. 5 and 6, a top layer 24 may be attached directly to top-side package contact 28 and back-side contact 20. Further, alternatively or in addition to, a heat sink and/or a metal foil layer 26 may be attached to the integrated circuit package.

FIGS. 10-12 illustrate cross-sectional views of exemplary integrated circuit packages (100, 110, and 120 respectively) as in FIGS. 4-6 with top-side pads 30 and/or isolating middle layers 32. Top-side pads 30 may be formed on top-side 3 of package module 2. Top layer 24 may be coupled to back-side 18 of chip 16 and top-side of package module 2 by way of isolating middle layer 32. Isolating middle layer may insulate, for example, a subset of vias 5, from direct electrical contact with top layer 24. Such an arrangement may be useful, for example, in chip stacking arrangements, or where insulated vias 35 are already connected (such as by various configurations of layered routing as disclosed above in connection with FIGS. 1-3) to another device or are to be reserved to establish other connections not related to top layer 24. Moreover, there may be metal patterning thereon, including, for example on a portion of top layer 24, isolating middle layer 32, connection pads of circuit interconnections 4, forward contacts 7, vias 5, and/or isolated vias 35. Such metal patterning may, for example, be employed for electrical routing therebetween.

FIG. 13 illustrates a cross-sectional view of an exemplary integrated circuit package 130 with multiple chips 36, 34. Combinations of the above embodiments may also be formed. For example, power chip 36 may be packaged, according to the chip-last approach as described herein, alongside logic chip 34 with the same chip-last technique. That is, two or more cavities may be formed within package module 2. Similarly, two or more chips as described above may be disposed within the cavities and physically, electrically, and/or thermically connected as heretofore described. In a logic chip plus power chip configuration, a portion of top layer 24 may be used, for example, for electrical routing between logic chip 34 and low power chip 36. Alternatively, electrical routing may take place within package module 2. As a further alternative, integrated circuit package 130 may include isolating middle layer 32 which may isolate chip 34 from physical, electrical, and/or thermal contact with top layer 24.

FIG. 14 illustrates a cross-sectional view of an exemplary integrated circuit package 140 with an isolated heat spreading layer 38. Isolated heat spreading layer 38 is electrically isolating and thermally conductive. AlN filled glues may be applied, for example, to achieve the electrically isolating yet thermally conductive functionality. Such a configuration may be advantageous where it is desirable to electrically isolate portions of top layer 24 from upper layers such as, for example, heat sink and/or metal foil layer 26.

FIG. 15 illustrates a cross-sectional view of an exemplary integrated circuit package 150 with a chip having through silicon vias (TSVs) 37. TSVs 37 vertically pass through chip 16 and thus provide electrical connection on back-side. TSVs may help to increase performance by facilitating a higher three-dimensional density, and/or lowering contact resistance to back-side 18. TSVs 37 may optionally be directly coupled to forward contacts 7 of chip 16, or to the internal circuitry of chip 16 (not shown). TSVs may also be used in multiple chip configurations such as exemplary integrated circuit package 130 described above with reference to FIG. 13.

FIGS. 16 and 17 illustrate cross-sectional views of exemplary integrated circuit packages (160 and 170 respectively) with a backside of nano metal or solder on plated, sputtered, or structured metal, and an optional isolated heat sink and/or metal foil layer 26 thereon. In particular, FIGS. 16 and 17 depict structured recesses 39 structured in top layer 24, top-side package contact 28, and heat sink and/or metal foil layer 26. Structured recesses 39 are functional for example, as part of the electrical routing on top-side 18 of package module 2. Such routing, for example, could be used to electrically connect stacked chip 41. Some methods of applying printed metal structures include, for example, ink jetting, or so called screen or stencil printing. While both of the methods may be used to apply structured metal, screen printing is generally less expensive while ink jetting results in a thinner and finer pitched application.

FIGS. 18-21 show another exemplary process flow, from a cross-sectional view, for fabricating an exemplary package module. The exemplary process flow, or method, for integrated circuit packaging may be implemented as follows.

In FIG. 18, package module 2 is formed in a manner similar to the process flow described in FIGS. 1-3 and its accompanying description above. In particular, package-part 180 includes package module 2 and is fabricated from successive build-up layers (a laminate) which define a top-side 3, a bottom-side 1 and circuit interconnections 4. Such circuit interconnections 4 may be vias formed in the manner described above with regard to vias 5 and/or include, for example, embedded passive components such as circuit wiring, capacitors, resistors, and/or inductors. For example, it may include layered routing 8, formed, for example of structured metal. Circuit interconnections 4 may be made using standard high density interconnections technology, and may have bottom-side pads 6 electrically coupled thereto provided on bottom-side 1 of package module 2. Further, in addition to traditional layering techniques, the build-up layering process may also include depositing thin film on an ultra-thinned core. Cavity 14 is formed on top-side 3 of package module 2. Solder balls 12 may be provided in electrical connection with vias 5 and/or circuit interconnections 4 providing a contact terminus on bottom-side 1 of package module 2 of integrated circuit package 10 for connection, such as to a printed circuit (PC) board.

FIG. 19 shows metallic layer 45 with photo structured surface 43. Photo structure surface 43 may be used to provide a structure for metallic layer 45, and may use several means to achieve the goal of providing a structure for metallic layer 45. For example, if photo structure surface 43 is a permanent resist, it is laminated onto metallic layer 45, imaged with appropriate exposure equipment, developed and then stripped from metallic layer 45. Alternatively, Laser Direct Structuring (LDS) may be used to remove the desired portion of photo structure surface 43 from metallic layer 45. A further alternative might include spray coating metallic layer 45 with polymide (PI) as photo structured surface 43. After PI is applied as photo structured surface 43 to metallic layer 45, it is allowed to dry and then exposed, developed and stripped. Using PI as photo structured surface 43 may provide stability during subsequent high temperature processing. As another alternative, photo structure surface 43 may be omitted or substituted with a printed solder stop on metallic layer 45.

The structure provided by photo structure surface 43 is useful for accurate processing as described below with respect to FIG. 20. Exposure of photo structured surface 43 is preferably micrometer precise. Once the desired exposure and processing of photo structured surface 43 has occurred, a small frame will be left on metallic layer 45. Small frame 42 is shown from the cross-sectional view as chip area 44 being free of photo structure surface 43 while the area surrounding chip area 44 has photo structure surface 43 present. Such a small frame, for example, may be on the order of 100 micrometers. The small frame should preferably match the size and attachment location of chip 16.

Figure 20:
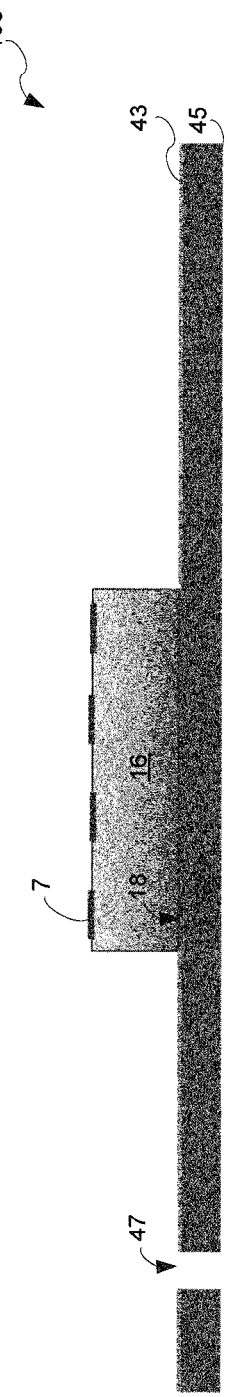

FIG. 20 shows chip 16 having a front-side with forward contacts 7 and back-side 18. Chip 16 is, for example, a power electronics chip and/or a high-performance logic chip. Back-side 18 of chip 16 may comprise a low ohmic contact. FIG. 20 further depicts metallic layer 45 having been attached to back-side 18 of chip 16 to form chip-part 190. Metallic layer 45 may be, for example, a metal foil layer and may have thermally conductive properties facilitating heat spreading. Furthermore, metallic layer 45, for example, might contain structured recesses, and may also be attached to a heat sink to facilitate further heat spreading.

The attachment of chip 16 to metallic layer 45 may involve a high temperature process such as diffusion soldering which are conducted at temperatures that may exceed the tolerance of package-part 180. Diffusion soldering is typically performed at relatively high temperatures in order to thin the solder. Diffusion soldering, for example, generally exceeds 200 degrees Celsius. The diffusion soldering between chip 16 and metallic layer 45 is preferably performed remotely and prior to disposing chip 16 into cavity 14. Thus package module 2 may not need to be constructed to withstand the relatively higher temperatures generally needed to perform diffusion soldering or other high temperature processes.

Photo structure surface 43 may be useful in correctly positioning chip 16 onto metallic layer 45 during attachment. Photo structure surface 43 may be particularly useful during high temperature processes such as diffusion soldering where solder flow and evaporation are relatively unpredictable. By forming photo structure surface 43 into a small frame as described above with respect to FIG. 19, the solder flow and evaporation may be restricted to the attachment location of chip 16. Thus photo structured surface 43 may be used for precise soldering onto metallic layer 45. Drilled hole 47 may also be made through metallic layer 45 in order to provide means for optical alignment in integrating chip-part 190 with package-part 180 as shown in FIG. 21.

Figure 21:
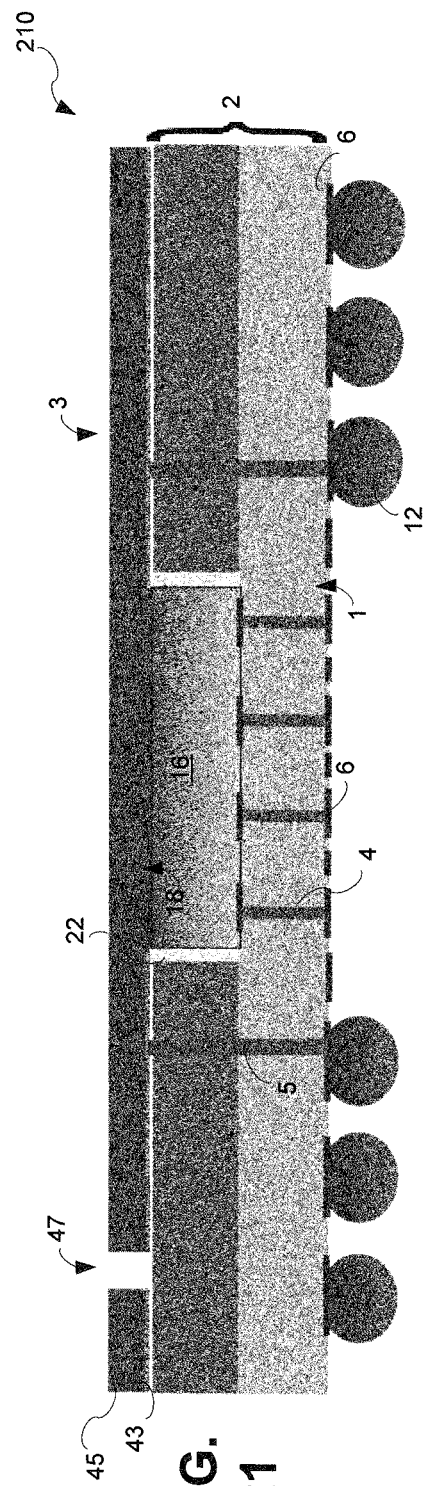

In FIG. 21, chip-part 190 is integrated with package-part 180 such that chip 16 is disposed in cavity 14. Chip 16 is disposed in cavity 14 such that forward contacts 7 are electrically connected to one or more of circuit interconnections 4 of package module 2, and metallic layer 45 is coupled to top-side 3 of package module 2. Metallic layer 45 may coupled to top-side 3 of package module 2 through various means available to provide physical and/or electrical coupling. X-ray imaging may be used in order to correctly align chip-part 190 with respect to package-part 180 during attachment, since the copper vias should generally be visible even through metallic layer 45. Metallic layer 45 may be coupled to top-side 3 of package module 2, for example, using a glue or nano paste. In this way integrated circuit package 200 may be configured, for example, so that current can flow vertically between a low ohmic contact on back-side 18 of chip 16 and the set of forward contacts of the chip. Further, a low ohmic contact on back-side 18 of chip 16 may be electrically connected by way of metallic layer 45, for example, to one or more vias formed in the package module. Thus current and/or signaling can be distributed as needed throughout integrated circuit package 200 as previously described above.

Figure 22:
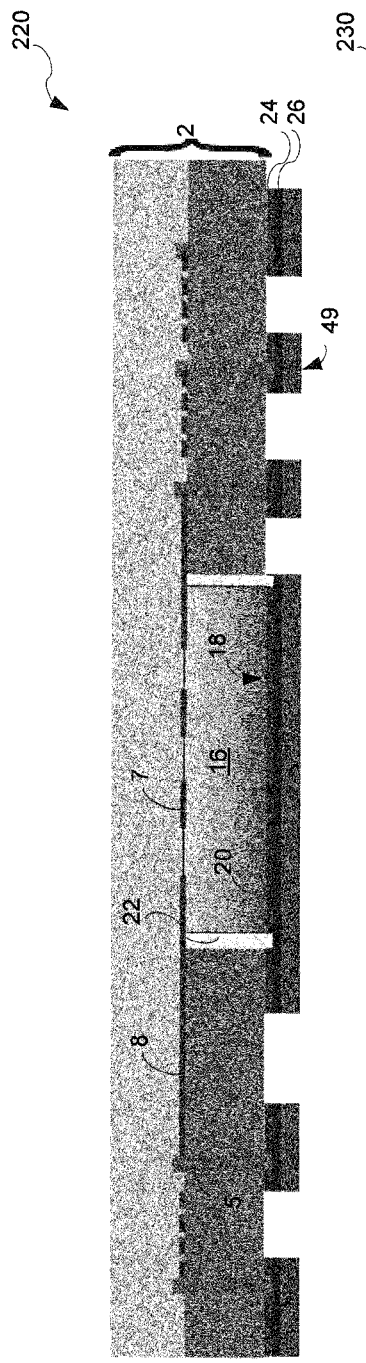
FIG. 22 illustrates a cross-sectional view of an exemplary integrated circuit package in a reverse mount configuration.

FIG. 22 illustrates a cross-sectional view of an exemplary integrated circuit package in a reverse mount configuration. Package module 220 may be constructed in accordance with the above description, and also as described with reference to FIG. 21, but rather than having the active side of chip 16 facing a connected PCB and back-side 18 of chip 16 facing away from the connected PCB, package module 220 is reversed such that the active side of chip 16 faces away from a connected PCB and back-side of chip 16 faces toward the connected PCB. Thus when connected to a PCB, a direct connection from back-side 18 of chip 16 is made to the connected PCB, and forward contacts 7 of chip 16 are connected by way of vias to the connected PCB. Both sets of connection paths, the direct connection from back-side 18 of chip 16 and forward contacts 7 of chip 16 connected by way of vias, may be configured into two routing layers connected through package connectors 49.

Package connectors 49 may be coupled to external circuitry, for example a PCB, by processing package module 220 an organic solder protect (OSP) process and then soldering package module 220 onto the PCB. Package connector 49 can be employed in all the disclosed embodiments as a substitute for solder balls 12. Further all of the disclosed embodiments can be configured such that the metallic layer connecting the back-side 18 of chip 16 is structured such that the package module is capable of being mounted by package connectors 49. As an example, package connector 49 can be employed for instance with the embodiment described with reference to FIG. 16. In such a configuration, FIG. 16 would be mounted in a reverse configuration such that back-side 18 of chip 16 is mountable facing down towards external circuitry such as a PCB. Solder balls 12 may not be needed in such a configuration, and as such might be removed.

Figure 23:
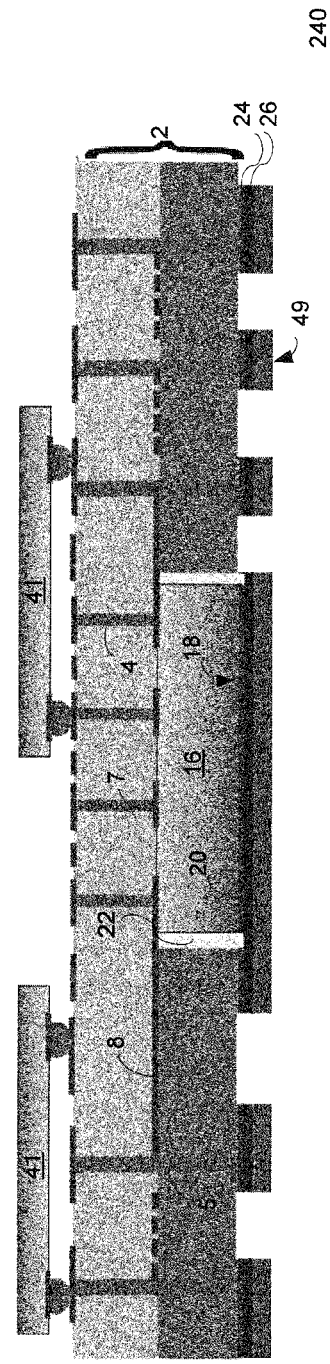

FIGS. 23-26 illustrate various further embodiments of a cross-sectional view of an exemplary integrated circuit package in a reverse mount configuration. In accordance with the description of FIGS. 17 and 22, FIG. 23 shows stacked chips 41 connected and integral to package module 230. As described above with regards to FIG. 22, rather than having the active side of chip 16 facing a connected PCB and back-side 18 of chip 16 facing away from the connected PCB, package module 230 is reversed such that the active side of chip 16 faces away from a connected PCB and back-side of chip 16 faces toward the connected PCB. Thus when connected to a PCB, a direct connection from back-side 18 of chip 16 is made to the connected PCB, and forward contacts 7 of chip 16 are connected by way of vias to the connected PCB. Both sets of connection paths, the direct connection from back-side 18 of chip 16 and forward contacts 7 of chip 16 connected by way of vias, may be configured into two routing layers connected through package connectors 49.

Figure 24:
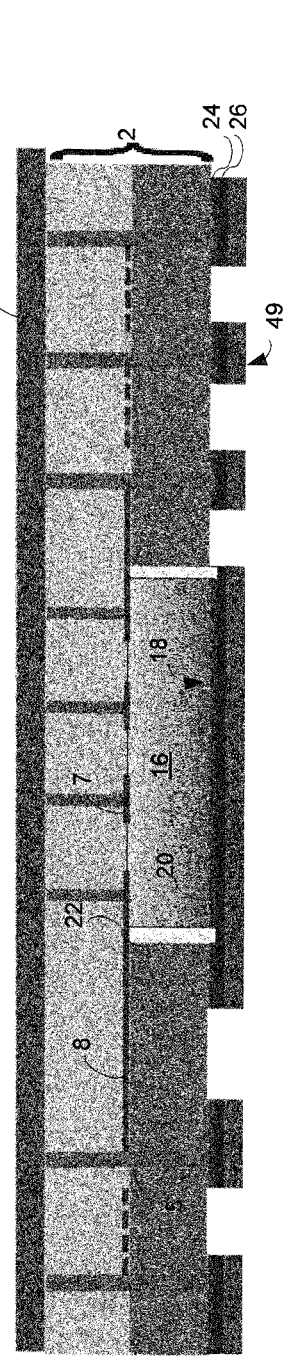

In accordance with above embodiments, FIG. 24 shows package module 240 in a reverse mount configuration. Further, package module 240 includes heat spreader 51, thus effectuating heat spreading on both sides of package module 240. That is, heat sink and/or metal foil layer 26 may provide heat spreading on the contact side of package module 240, while heat spreader 51 provides heat spreading on the other side of package module 240. Heat spreader 51 may be at least partly electrically isolated.

In accordance with above embodiments, FIG. 25 likewise shows package module 250 in a reverse mount configuration with heat spreader 51. As compared to FIG. 24, heat spreader 51 in FIG. 25 is attached to package module 2 by nano paste 53. Similarly, FIG. 26 shows package module 260 in a reverse mount configuration with heat spreader 51 connected to package module 2 by thermal glue 55.

A person skilled in the art will recognize that combinations of the above exemplary embodiments may be formed. For example, any of integrated circuit packages 10, 40, 50, 60, 70, 80, 90, 100, 110, 120, 130, 140, 150, 160, 170 and 210 be configured in a reverse mount configuration as shown in FIGS. 22-26. As another example, any of integrated circuit packages 10, 40, 50, 60, 70, 80, 90, 100, 110, 120, 130, 140, 150, 160 and 170 may implement the process flow shown in FIGS. 18-21, in particular, chip 16 may be diffusion soldered to metallic layer 45 such that the metallic layer 45 covers at least a part of back-side 18 of chip 16.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. An integrated circuit packaging method comprising:
   fabricating a package module from successive build-up layers which define circuit interconnections;
   forming a cavity on a top-side of the package module;
   attaching a metalized back-side of a chip onto a metallic layer, the chip having a front-side with at least one forward contact;
   disposing the chip in the cavity such that at least one forward contact is electrically connected to at least one of the circuit interconnections of the package module; and
   coupling the metallic layer that is attached to the chip onto the top-side of the package module.

2. The integrated circuit packaging method recited in claim 1 wherein attaching the metalized back-side of the chip onto the metallic layer is done with a high temperature process.

3. The integrated circuit packaging method recited in claim 1 wherein attaching the metalized back-side of the chip onto the metallic layer is done with a diffusion soldering process.

4. The integrated circuit packaging method recited in claim 1 wherein the metallic layer is a metal foil layer.

5. The integrated circuit packaging method recited in claim 1 wherein the back-side of the chip has a low ohmic contact.

6. The integrated circuit packaging method recited in claim 5 wherein current flows vertically between the low ohmic contact and the at least one forward contact of the chip.

7. The integrated circuit packaging method recited in claim 6 wherein the low ohmic contact is electrically connected to the metallic layer, and therethrough to one or more vias formed in the package module.

8. The integrated circuit packaging method recited in claim 1 wherein the metallic layer has thermally conductive properties.

9. The integrated circuit packaging method recited in claim 8 further comprising attaching the metallic layer to a heat sink.

10. The integrated circuit packaging method recited in claim 1 wherein the chip further comprises through silicon vias.

11. The integrated circuit packaging method recited in claim 1 wherein the metallic layer is coupled to the back-side of the chip or the top-side of the package module by way of an isolating middle layer.

* * * * *